(12) United States Patent
Takekoshi

(10) Patent No.: US 10,373,798 B2
(45) Date of Patent: Aug. 6, 2019

(54) MULTI CHARGED PARTICLE BEAM INSPECTION APPARATUS, AND MULTI CHARGED PARTICLE BEAM INSPECTION METHOD

(71) Applicant: NUFLARE TECHNOLOGY, INC., Kanagawa (JP)

(72) Inventor: Hidekazu Takekoshi, Fujisawa (JP)

(73) Assignee: NUFLARE TECHNOLOGY, INC., Kanagawa (JP)

( * ) Notice: Subject to any disclaimer, the term of this patent is extended or adjusted under 35 U.S.C. 154(b) by 0 days.

(21) Appl. No.: 15/902,157

(22) Filed: Feb. 22, 2018

(65) Prior Publication Data

US 2018/0286630 A1    Oct. 4, 2018

(30) Foreign Application Priority Data

Apr. 3, 2017  (JP) ................................. 2017-073461

(51) Int. Cl.
| | |
|---|---|
| H01J 37/28 | (2006.01) |
| H01J 37/26 | (2006.01) |
| H01J 37/244 | (2006.01) |
| H01J 37/153 | (2006.01) |
| H01J 37/22 | (2006.01) |

(52) U.S. Cl.
CPC ............ H01J 37/26 (2013.01); H01J 37/153 (2013.01); H01J 37/222 (2013.01); H01J 37/244 (2013.01); *H01J 2237/153* (2013.01); *H01J 2237/2002* (2013.01); *H01J 2237/2806* (2013.01); *H01J 2237/2817* (2013.01)

(58) Field of Classification Search
CPC .............. H01J 37/26; H01J 2237/2817; H01J 2237/2002
See application file for complete search history.

(56) References Cited

U.S. PATENT DOCUMENTS

2004/0135515 A1* 7/2004 Hamashima .......... F01N 3/2828
                                                         315/5.41
2007/0023689 A1* 2/2007 Iizuka .................... B82Y 10/00
                                                         250/492.22

FOREIGN PATENT DOCUMENTS

JP          2002-208371 A      7/2002

* cited by examiner

*Primary Examiner* — Eliza W Osenbaugh-Stewart
(74) *Attorney, Agent, or Firm* — Cermak Nakajima & McGowan LLP; Tomoko Nakajima

(57) ABSTRACT

A multi charged particle beam inspection apparatus includes a plurality of sensors, arranged inside or on a periphery of a secondary electron image acquisition mechanism, to measure a plurality of interfering factors, a determination circuit to determine, for each interfering factor, whether change exceeding a corresponding threshold is a first case which returns to the original state within a predetermined time period, or a second case which does not return to the original state even if the predetermined time period has passed, and a comparison circuit to input a reference image of a region corresponding to the secondary electron image acquired, and compare the secondary electron image with the reference image, wherein in the case where change of the second case occurs, the secondary electron image acquisition mechanism suspends the acquisition operation of the secondary electron image, and calibrates a change amount of the multiple charged particle beams.

19 Claims, 9 Drawing Sheets

MULTI CHARGED PARTICLE BEAM INSPECTION APPARATUS, AND MULTI CHARGED PARTICLE BEAM INSPECTION METHOD

CROSS-REFERENCE TO RELATED APPLICATION

This application is based upon and claims the benefit of priority from the prior Japanese Patent Application No. 2017-073461 filed on Apr. 3, 2017 in Japan, the entire contents of which are incorporated herein by reference.

BACKGROUND OF THE INVENTION

Field of the Invention

Embodiments of the present invention relate to a multi charged particle beam inspection apparatus and a multi charged particle beam inspection method. For example, embodiments of the present invention relate to an inspection apparatus and method for inspecting a pattern by acquiring a secondary electron image of a pattern image emitted by irradiation with an electron beam.

Description of Related Art

In recent years, with the advance of high integration and large capacity of large-scale integration (LSI) circuits, the line width (critical dimension) required for circuits of semiconductor elements is becoming progressively narrower. Such semiconductor elements are manufactured by circuit formation of exposing and transferring a pattern onto a wafer by means of a reduced projection exposure apparatus known as a stepper while using an original or "master" pattern (also called a mask or a reticle, hereinafter generically referred to as a mask) with a circuit pattern formed thereon.

Since LSI manufacturing requires a tremendous amount of manufacturing cost, it is crucial to improve its yield. However, as typified by a 1-gigabit DRAM (Dynamic Random Access Memory), the scale of patterns configuring an LSI has become on the order of nanometers from submicrons. In recent years, with miniaturization of dimensions of LSI patterns formed on a semiconductor wafer, dimension to be detected as a pattern defect has become extremely small. Therefore, a pattern inspection apparatus for inspecting defects of ultrafine patterns transferred and exposed onto a semiconductor wafer needs to be more highly accurate. Further, one of major factors that decrease the yield of the LSI manufacturing is due to pattern defects on the mask used for exposing and transfer printing an ultrafine pattern onto a semiconductor wafer by the photolithography technology. Therefore, a pattern inspection apparatus for inspecting defects on a transfer mask used in manufacturing LSI needs to be more highly accurate.

As an inspection method, there is known a method of comparing an optical image obtained by imaging a pattern formed on a substrate (target object or "sample") such as a semiconductor wafer and a lithography mask at a predetermined magnification by using a magnification optical system with design data or an optical image obtained by imaging the same pattern on the target object. For example, the methods described below are known as pattern inspection methods: the "die-to-die inspection" method that compares data of optical images of identical patterns at different positions on the same mask; and the "die-to-database inspection" method that inputs, into an inspection apparatus, writing data (design pattern data) generated by converting pattern-designed CAD data to a writing apparatus specific format to be input to the writing apparatus when a pattern is written on the mask, generates a design image data (reference image) based on the input writing data, and compares the generated design image with an optical image (serving as measured target data) obtained by imaging the pattern. In such inspection methods for use in the inspection apparatus, a substrate to be inspected (an inspection substrate or "object" to be examined) is placed on the stage so that a light flux may scan the substrate (target object) as the stage moves in order to perform an inspection. Specifically, the substrate to be inspected is irradiated with a light flux from the light source through the illumination optical system. The light transmitted through the inspection substrate or reflected therefrom forms an image on a sensor through the optical system. The image captured by the sensor is transmitted as measured target data to the comparison circuit. After performing positioning between images, the comparison circuit compares measured target data with reference data in accordance with an appropriate algorithm, and determines that there exists a pattern defect if the compared data are not identical.

The pattern inspection apparatus described above acquires an optical image by irradiating an inspection substrate with a laser beam in order to capture a transmission image or a reflection image of a pattern formed on the substrate. On the other hand, there has been developed an inspection apparatus which acquires a pattern image by irradiating an inspection substrate with multiple electron beams in order to detect a secondary electron corresponding to each beam emitted from the inspection substrate (e.g., refer to Japanese Patent Application Laid-open (JP-A) No. 2002-208371).

In the case of electron beam irradiation, if installation environment (interfering factor) such as a magnetic field, temperature, vibration, etc. at an installation position changes, beam drift occurs. Therefore, before delivering a writing apparatus and/or an inspection apparatus using electron beams to a customer, it is necessary to previously define such installation environment specifications at the customer setting position. However, there is a problem if strict installation environment specifications are defined, production facilities or equipment on the customer side need to be enhanced, which results in a cost increase based on the enhancement, and by contrast, if loose installation environment specifications are defined, corresponding facilities or equipment on the apparatus side need to be enhanced, which results in a cost increase based on the enhancement.

BRIEF SUMMARY OF THE INVENTION

According to one aspect of the present invention, a multi charged particle beam inspection apparatus includes a secondary electron image acquisition mechanism configured to perform an acquisition operation of a secondary electron image of a secondary electron including a reflected electron emitted from a substrate due to irradiation with multiple charged particle beams on the substrate, a plurality of sensors, arranged inside or on a periphery of the secondary electron image acquisition mechanism, configured to measure a plurality of interfering factors, a determination circuit configured to determine, for each of the plurality of interfering factors, whether change exceeding a corresponding threshold is a first case which returns to an original state within a predetermined time period, or a second case which does not return to the original state even if the predetermined time period has passed, and a comparison circuit configured to input a reference image of a region corresponding to the secondary electron image acquired, and compare the secondary electron image with the reference image, wherein in a case where change of the second case occurs, the secondary electron image acquisition mechanism suspends the acquisition operation of the secondary electron image, and calibrates a change amount of the multiple charged particle beams.

According to another aspect of the present invention, a multi charged particle beam inspection method includes performing an acquisition operation of a secondary electron image which includes a reflected electron emitted from a substrate due to irradiation with multiple charged particle beams on the substrate, measuring a plurality of interfering factors inside or on a periphery of a secondary electron image acquisition mechanism, determining, for each of the plurality of interfering factors, in a case where change exceeding a corresponding threshold occurs in at least one of the plurality of interfering factors, whether the change is a first case which returns to an original state within a predetermined time period, or a second case which does not return to the original state even if the predetermined time period has passed, suspending the acquisition operation of the secondary electron image in a case where change of the second case occurs and calibrating a change amount of the multiple charged particle beams, and inputting a reference image of a region corresponding to the secondary electron image acquired and comparing the secondary electron image with the reference image, wherein the acquisition operation of the secondary electron image is restarted after the calibrating.

DETAILED DESCRIPTION OF THE INVENTION

In a writing apparatus for writing patterns onto a mask or wafer using electron beams, if degradation of writing performance occurs during writing, even though temporarily, due to change in installation environment, the quality of the writing mask or wafer becomes affected directly. Consequently, the mask or wafer whose quality has been degraded must be discarded. On the other hand, with respect to an inspection apparatus for inspecting a mask or wafer on which pattern formation has already been completed, since the quality itself of the inspection object to be measured (mask or wafer) does not change though an extraordinary result of inspection temporarily occurs due to change in the installation environment, it is possible to re-perform the inspection, which is an advantage not obtainable with the writing apparatus. Accordingly, a method is desired that can reduce the cost while utilizing this advantage.

Embodiments below describe a multi charged particle beam inspection apparatus and method by which enhancement of production facilities or equipment on the customer side to be in accordance with strict installation environment specifications can be inhibited, and enhancement of corresponding facilities or equipment on the apparatus side can also be inhibited.

Embodiments below describe a configuration using an electron beam as an example of a charged particle beam. The charged particle beam is not limited to the electron beam, and other charged particle beam such as an ion beam may also be used. Moreover, Embodiments below describe the case of using multiple beams composed of a plurality of electron beams, but it is not limited thereto.

The case of using a single beam may also be applied.

First Embodiment

Figure 1:
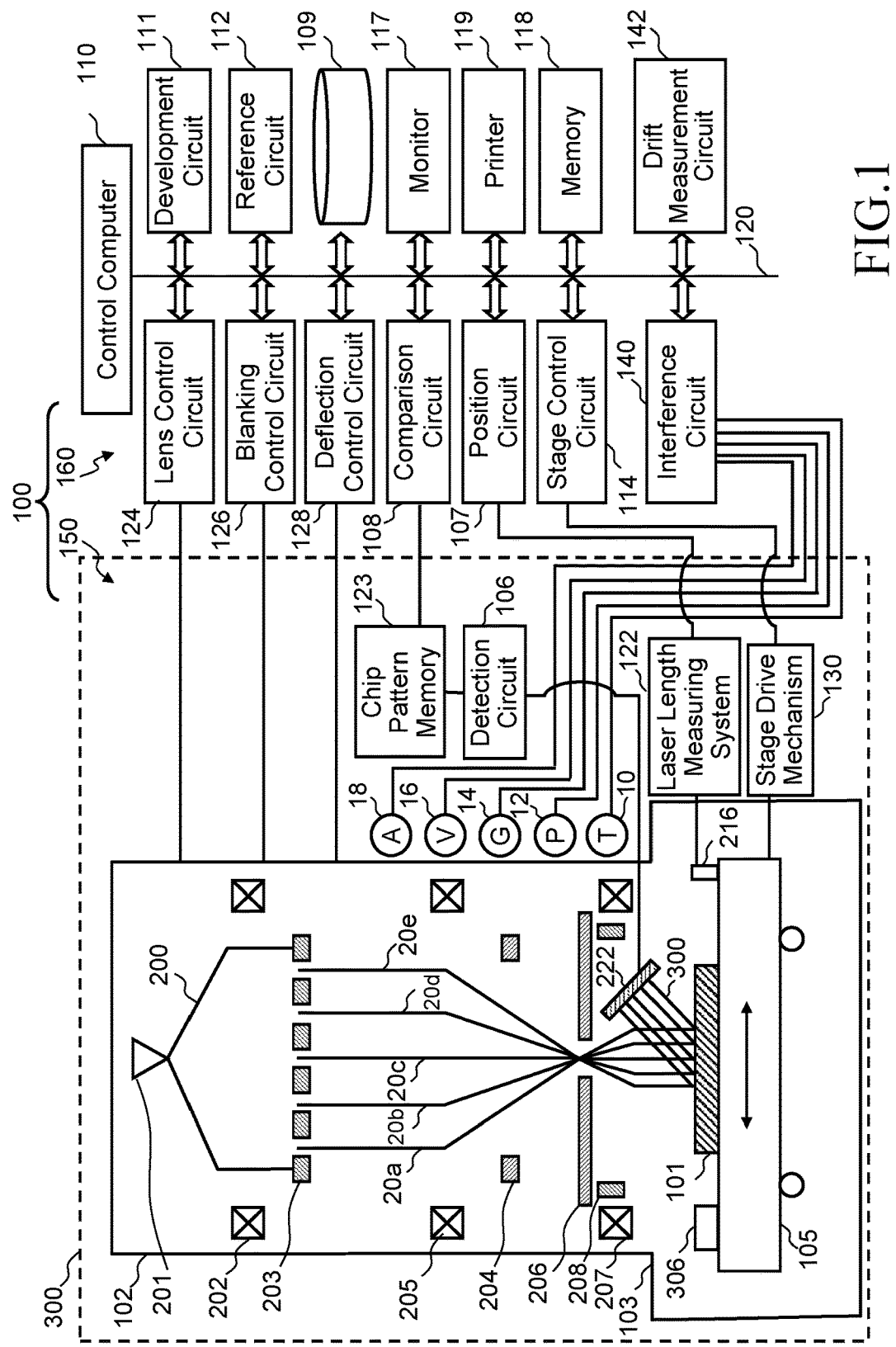
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on the substrate is an example of a multi charged particle beam inspection apparatus. The inspection apparatus 100 includes a secondary electron image acquisition mechanism 150 and a control system 160. The secondary electron image acquisition mechanism 150 includes an electron beam column 102 (electron optical column), an inspection chamber 103, a detection circuit 106, a chip pattern memory 123, a stage drive mechanism 130, and a laser length measurement system 122. In the electron beam column 102, there are arranged an electron gun 201, an illumination lens 202, a shaping aperture array substrate 203, a reducing lens 205, a blanking deflector 204, a limiting aperture substrate 206, an objective lens 207, a deflector 208, and a detector 222.

In the inspection chamber 103, there is arranged an XY stage 105 which is movable at least in the x-y directions. On the XY stage 105, there is placed a substrate 101 on which a plurality of chip patterns to be inspected have been formed. The substrate 101 may be an exposure mask or a semiconductor substrate such as a silicon wafer. The substrate 101 is placed with its pattern forming surface facing upward, for example. Moreover, on the XY stage 105, there is arranged a mirror 216 which reflects a laser beam for measuring a laser length emitted from the laser length measurement system 122 arranged outside the inspection chamber 103. Furthermore, on the XY stage 105, there is arranged a calibration mark 306 for calibrating irradiation positions of multiple beams 20. The detector 222 is connected, at the outside of the electron beam column 102, to the detection circuit 106. The detection circuit 106 is connected to the chip pattern memory 123.

In the control system 160, a control computer 110 is connected, through a bus 120, to a position circuit 107, a comparison circuit 108, a development circuit 111, a reference circuit 112, a stage control circuit 114, a lens control circuit 124, a blanking control circuit 126, a deflection control circuit 128, an interference circuit 140, a drift measurement circuit 142, a storage device 109 such as a magnetic disk drive, etc., a monitor 117, a memory 118, and a printer 119. The chip pattern memory 123 is connected to the comparison circuit 108.

The XY stage 105 is driven by the stage drive mechanism 130 controlled by the stage control circuit 114 under the control of the control computer 110. The XY stage 105 can move a stroke distance by which all the surface of the inspection region of the substrate 101 can be irradiated with the multiple beams 20. The XY stage 105 can be moved by a drive system such as a three-axis (X, Y, θ) motor, which drives the stage in the directions of x, y, and θ. For example, a step motor can be used as each of these X, Y, and θ motors (not shown). The XY stage 105 is movable in the horizontal direction and the rotation direction by the motors of the X-axis, Y-axis, and θ-axis. The movement position of the XY stage 105 is measured by the laser length measurement system 122, and supplied (transmitted) to the position circuit 107. The laser length measurement system. 122 measures the position of the XY stage 105 by receiving a reflected light from the mirror 216, based on the principle of laser interferometry.

The detector 222 is arranged above the XY stage 105 in a manner such that the detection surface faces the intersection between the surface of the substrate 101 arranged on the XY stage 105 and the optical axis. For example, the detection surface is arranged to be inclined with respect to the surface of the substrate 101 at an angle from 15 to 75 degrees. More preferably, the detection surface is arranged to be inclined at an angle between 30 and 60 degrees, for example, an angle 45 degrees.

Although, here, the detector 222 is shown as an example, it is not limited thereto, and more detectors may further be arranged.

A high voltage power supply circuit (not shown) is connected to the electron gun 201. The high voltage power supply circuit applies an acceleration voltage to between the cathode and the anode (not shown) in the electron gun 201. In addition to this applied acceleration voltage, by applying a predetermined bias voltage, and heating the cathode at a predetermined temperature, electrons emitted from the cathode are accelerated to become electron beams which are to be emitted. For example, electromagnetic lenses are used as the illumination lens 202, the reducing lens 205, and the objective lens 207, and all of them are controlled by the lens control circuit 124. A pair of electrodes which can collectively deflect the multiple beams 20 is used as the blanking deflector 204, and controlled by the blanking control circuit 126. The deflector 208 is configured by at least four electrodes, and controlled by the deflection control circuit 128.

The secondary electron image acquisition mechanism 150 is arranged in an installation environment 300 such as a clean room prepared by the user, for example. On the other hand, the control system 160 is arranged in the control room prepared by the user. Moreover, a plurality of sensors for measuring a plurality of interfering (disturbing) factors are arranged inside or on the periphery of the secondary electron image acquisition mechanism 150 in the installation environment 300. In the example of FIG. 1, a temperature sensor 10, an atmospheric air pressure sensor 12, a magnetic sensor 14, a vibration sensor 16, and a sound (acoustic) sensor 18 are arranged on the periphery (outside of the electron beam column 102) of the secondary electron image acquisition mechanism 150 in the installation environment 300. Results measured by the temperature sensor 10, the atmospheric air pressure sensor 12, the magnetic sensor 14, the vibration sensor 16, and the sound sensor 18 are output to the interference circuit 140. Although the case of arranging each sensor on the outside of the electron beam column 102 in order to measure an interference (disturbance) occurring in the installation environment 300 is here described, arranging the sensors inside the electron beam column 102 is not excluded as long as interference occurring in the installation environment 300 inside the electron beam column 102 can be measured. Moreover, the interfering factor to be measured is not limited to temperature, atmospheric air pressure, magnetic field, vibration, and sound (acoustics). Other interfering factors may be measured. Moreover, it is not limited to the case of measuring all of the temperature, atmospheric air pressure, magnetic field, vibration, and sound. It may also be acceptable to use, as an interfering factor, at least one of the temperature, atmospheric air pressure, magnetic field, vibration, and sound.

In the case of the substrate 101 being a semiconductor substrate, exposure image data, which defines an exposure image to be formed on the semiconductor substrate when a mask pattern of the exposure mask is exposure transferred to the semiconductor substrate, is input from the outside of the inspection apparatus 100, and stored in the storage device 109. In the case of the substrate 101 being an exposure mask, writing data (design data) which is basis for forming a plurality of figure patterns on the substrate 101 is input from the outside of the inspection apparatus 100, and stored in the storage device 109.

FIG. 1 shows configuration elements necessary for describing the first embodiment. It should be understood that other configuration elements generally necessary for the inspection apparatus 100 may also be included therein.

Figure 2:
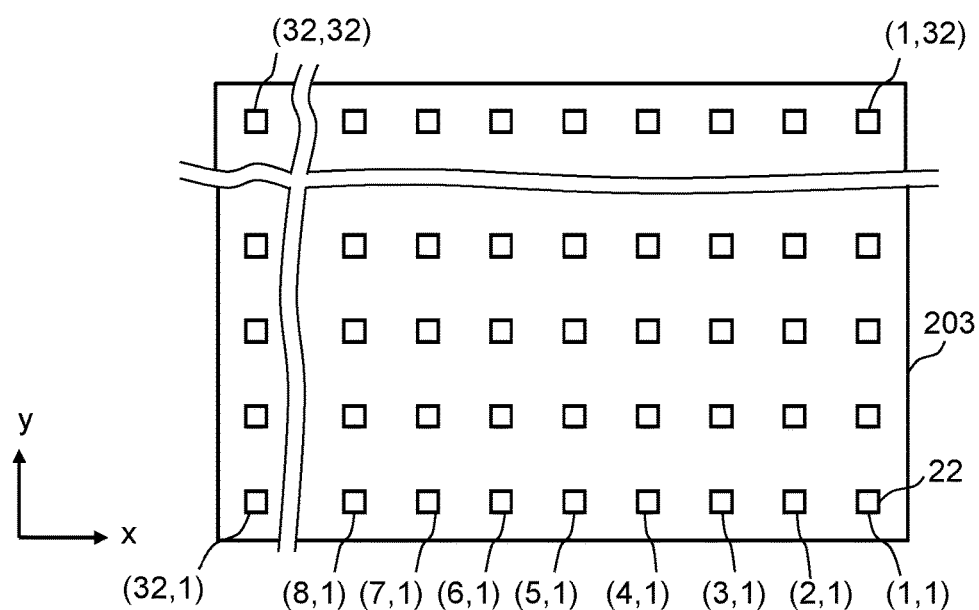
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of n columns wide (x direction) and m rows long (y direction) are two-dimensionally formed, like a matrix, at a predetermined arrangement pitch in the shaping aperture array substrate 203, where one of n and m is an integer of 1 or more, and the other is an integer of 2 or more. In FIG. 2, for example, holes 22 of 32 (columns in x direction)×32 (rows in y direction) are formed. Each of the holes 22 is a quadrangle having the same dimension, shape, and size. Alternatively, each of the holes 22 may be a circle with the same outer diameter. The multiple beams 20 are formed by letting portions of an electron beam 200 individually pass through a corresponding hole of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where holes are arranged like a grid in the width and length directions. For example, with respect to the k-th and the (k+1)th rows which are arrayed in the length direction (y direction) and each of which is in the x direction, each hole in the k-th row and each hole in the (k+1)th row may be mutually displaced in the width direction (x direction) by a dimension "a". Similarly, with respect to the (k+1)th and the (k+2)th rows which are arrayed in the length direction (y direction) and each of which is in the x direction, each hole in the (k+1)th row and each hole in the (k+2)th row may be mutually displaced in the width direction (x direction) by a dimension "b". Alternatively, other configuration may be employed.

Figure 3:
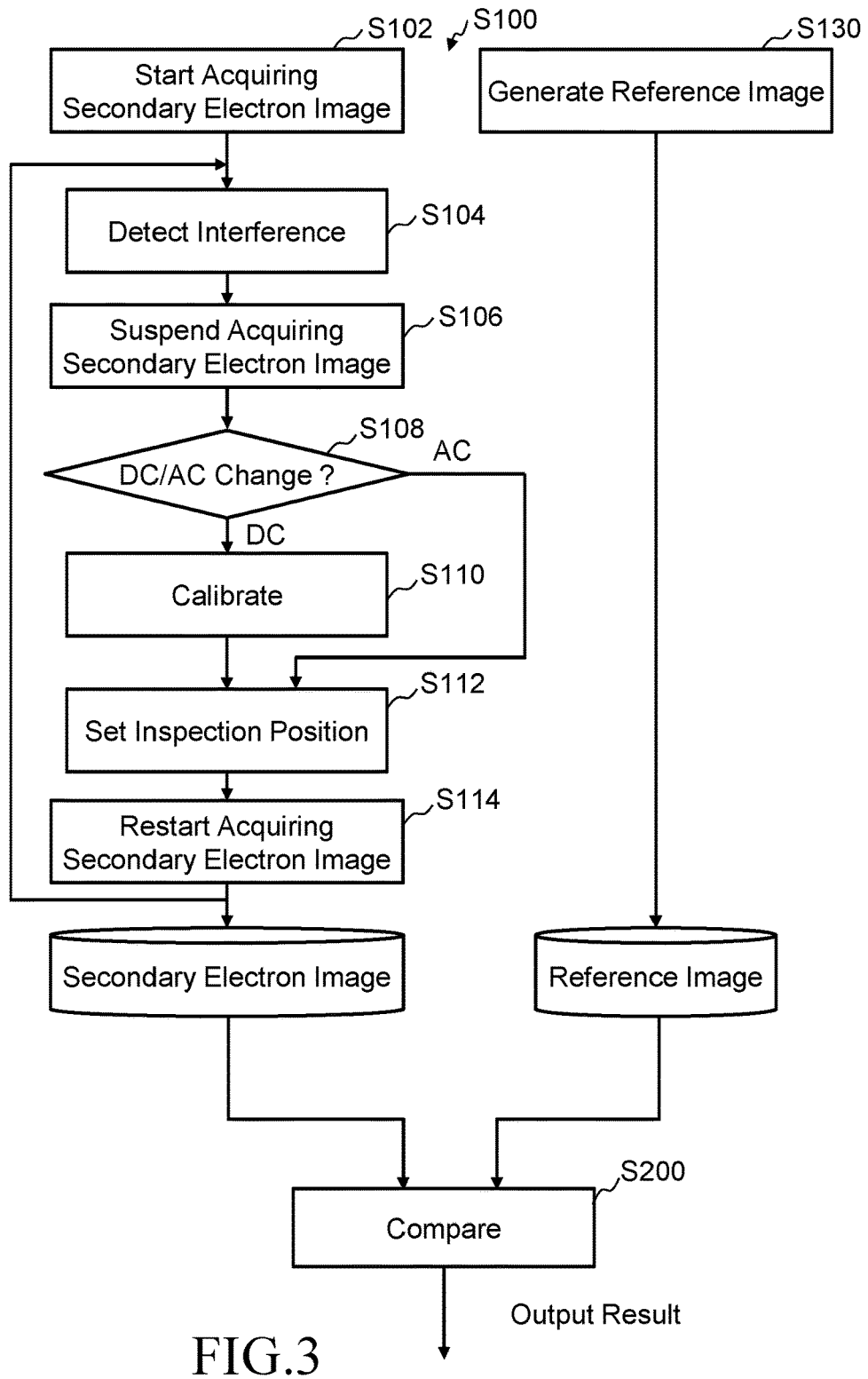
FIG. 3 is a flowchart showing main steps of a multi beam inspection method according to the first embodiment.

FIG. 3 is a flowchart showing main steps of a multi beam inspection method according to the first embodiment. In FIG. 3, the multi beam inspection method of the first embodiment executes a series of steps: a secondary electron image acquisition step (S100), a reference image generation step (S130), and a comparison step (S200). In the secondary electron image acquisition step (S100), a series of processing is executed as the internal processing: secondary electron image acquisition start processing (S102), interference detection processing (S104), secondary electron image acquisition suspending processing (S106), determination processing (S108), calibration processing (S110), inspection position setting processing (S112), and secondary electron image acquisition restart processing (S114).

In the secondary electron image acquisition step (S100), the secondary electron image acquisition mechanism 150 acquires a secondary electron image including reflection electrons emitted from the substrate 101 due to irradiation with the multiple beams 20 on the substrate 101. Therefore, first, acquisition of a secondary electron image is started.

In the secondary electron image acquisition start processing (S102), the secondary electron image acquisition mechanism 150 starts acquiring a secondary electron image. Operations of the secondary electron image acquisition mechanism 150 will be described below.

The electron beam 200 emitted from the electron gun 201 (emission source) almost perpendicularly (e.g., vertically) illuminates the whole of the shaping aperture array substrate 203 by the illumination lens 202. A plurality of quadrangular holes (openings) 22 are formed in the shaping aperture array substrate 203. The region including all the plurality of holes 22 is irradiated with the electron beam 200. For example, a plurality of quadrangular electron beams (multiple beams) 20a to 20e are formed by letting portions of the electron beam 200, which irradiates the positions of a plurality of holes 22, individually pass through a corresponding hole of the plurality of holes of the shaping aperture array substrate 203.

The multiple beams 20a to 20e having passed through the shaping aperture array substrate 203 are reduced by the reducing lens 205, and go toward the hole in the center of the limiting aperture substrate 206. At this stage, the multiple beams 20a to 20e are blanking-controlled by the blanking deflector 204. The multiple beams 20a to 20e which were collectively deflected by the blanking deflector 204 deviate (shift) from the hole in the center of the limiting aperture substrate 206 and are blocked by the limiting aperture substrate 206 (beam OFF). On the other hand, the multiple beams 20 which were not deflected by the blanking deflector 204 pass through the hole in the center of the limiting aperture substrate 206 as shown in FIG. 1. In such a way, blanking control is performed by the collective deflection of the blanking deflector 204 so as to control ON/OFF of the beams. One shot of multiple beams is formed by the multiple beams 20 each of which has been made during a period from becoming beam ON to becoming beam OFF and has passed through the limiting aperture substrate 206. The multiple beams 20 having passed through the limiting aperture substrate 206 are focused on the substrate 101 by the objective lens 207 so as to be a pattern image of a desired reduction ratio. Then, respective beams (the whole of the multiple beams 20) having passed through the limiting aperture substrate 206 are collectively deflected in the same direction by the deflector 208 in order to irradiate respective beam irradiation positions on the substrate 101. Ideally, the multiple beams 20 irradiating at a time are aligned at pitches obtained by multiplying the arrangement pitch of a plurality of holes 22 of the shaping aperture array substrate 203 by a desired reduction ratio described above. Thus, the electron beam column 102 ideally irradiates the substrate 101 with two-dimensional n×m multiple beams 20 at a time. Secondary electrons 300 being a flux of secondary electrons corresponding to each beam of the multiple beams 20, emitted from the substrate 101 because the multiple beams 20 irradiate desired positions of the substrate 101, are detected when being incident to the detector 222. In other words, for each beam of the multiple beams 20, the detector 222 detects secondary electrons 300 emitted from one position of the substrate 101 which is irradiated with one beam.

Figure 4:
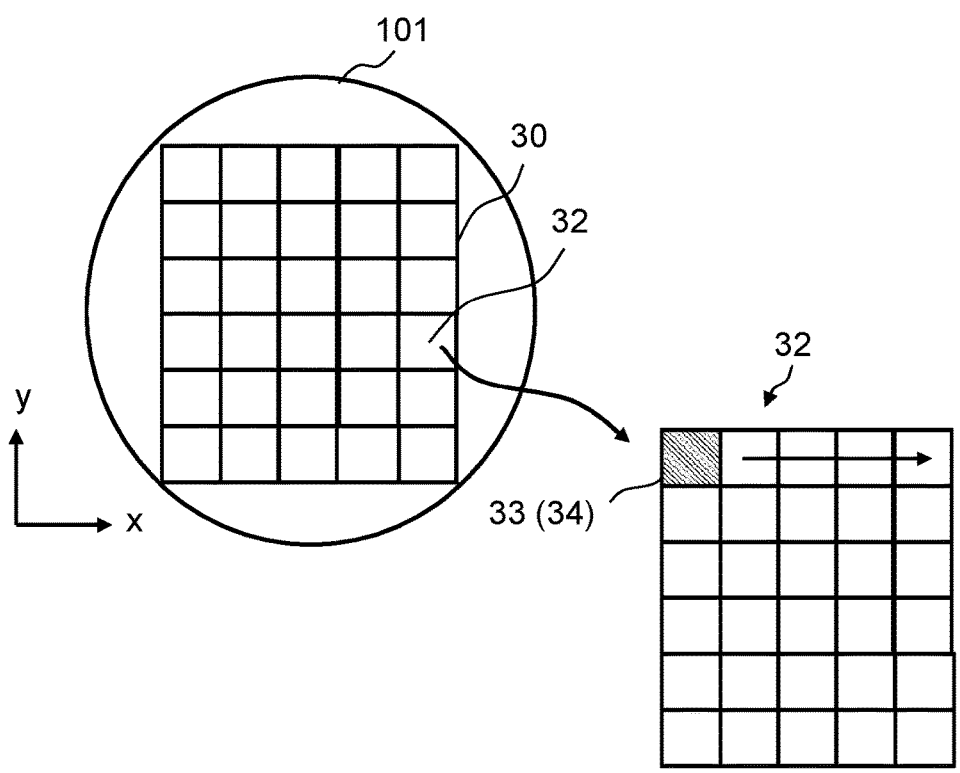
FIG. 4 is a conceptual diagram describing an example of a scanning operation according to the first embodiment.

FIG. 4 is a conceptual diagram describing an example of a scanning operation according to the first embodiment. The example of FIG. 4 shows the case where the substrate 101 to be inspected is a semiconductor wafer. In an inspection region 30 of the substrate 101, there are formed a plurality of chips 32 (die) in an array, each having predetermined width and length in the x and y directions, for example. Each chip 32 is formed to be, for example, 30 mm×25 mm on the substrate 101. Pattern inspection is performed for each chip 32. For example, the region of each chip 32 is virtually divided into a plurality of unit inspection regions 33 by the width (x direction) and the length (y direction) being the same as the width and length of an irradiation region 34 which can be irradiated with one irradiation of the entire multiple beams 20. The size of the irradiation region 34 can be defined, for example, by [(pitch between beams in the x direction on the substrate)×(the number of beams in the x direction)]×[(pitch between beams in the y direction on the substrate)×(the number of beams in the y direction)].

First, the XY stage 105 is moved to make an adjustment so that the irradiation region 34, which can be irradiated with one irradiation of the multiple beams 20, may be located at the position of the unit inspection region 33 at one (e.g., upper left end) of the four corners of the first chip 32, and then, a scanning operation is started. According to the first embodiment, for example, by repeating a "step and repeat" operation, each unit inspection region 33 is scanned by the multiple beams 20 while the irradiation region 34 is shifted one by one in the x direction by the width of the irradiation region 34. After scanning all the unit inspection regions 33 aligned in the x direction in the same row, where rows are arrayed (stacked) in the y direction, the stage position is moved in the y direction in order to similarly scan the unit inspection regions 33 aligned in the x direction in a next row, being the next row in the y direction, by the multiple beams 20. This operation is repeated until scanning the region of one chip 32 is completed. Then, the XY stage 105 is moved to make an adjustment so that the irradiation region 34, which can be irradiated with one irradiation of the multiple beams 20, may be located at the position of the unit inspection region 33 at one (e.g., upper left end) of the four corners of the next chip 32, and then, another scanning operation is similarly performed. By repeating this operation, all the chips 32 can be scanned.

In the case of the substrate 101 to be inspected being an exposure mask, the inspection region (chip region) of the mask is virtually divided into a plurality of strip-shaped stripe regions by the width size in the y direction being approximately the same as the irradiation region 34. For each stripe region, while shifting the irradiation region 34 in the x direction in the same stripe region, the multiple beams 20 perform scanning similarly to what is described above.

Figure 5:
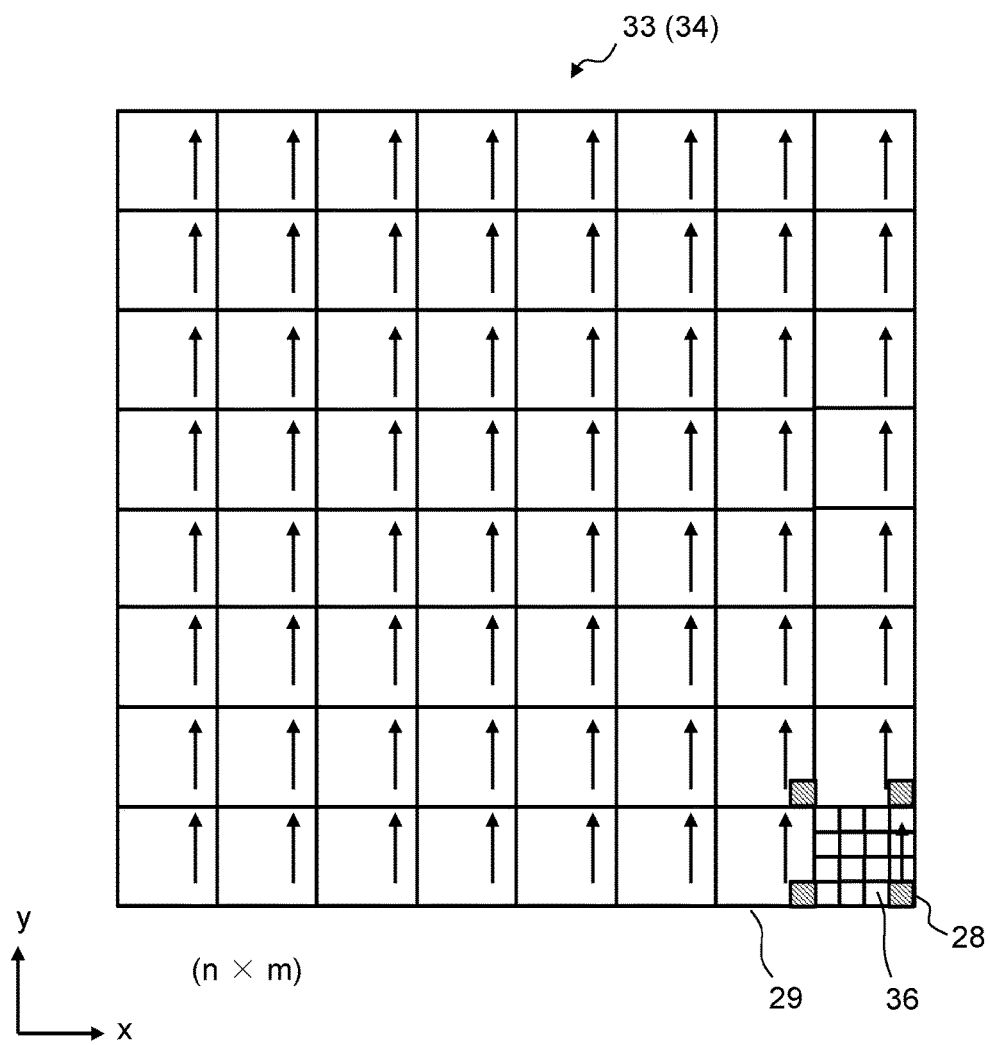
FIG. 5 is a conceptual diagram describing an example of details of a scanning operation according to the first embodiment.

FIG. 5 is a conceptual diagram describing an example of details of a scanning operation according to the first embodiment. FIG. 5 shows an example of scanning a certain unit inspection region 33 (irradiation region 34). In FIG. 5, the unit inspection region 33 is divided into a plurality of mesh regions by the beam size of multiple beams, for example. Each mesh region serves as a measurement pixel 36 (unit irradiation region). With respect to a plurality of measurement pixels 28 whose number is equal to the number of beams emittable as one irradiation of the multiple beams 20, namely, a plurality of measurement pixels 28 are irradiation positions of beams of one shot of the multiple beams 20, the pitch between adjacent measurement pixels 28 is the pitch between beams of the multiple beams. In the example of FIG. 5, one sub-irradiation region 29 is a square region surrounded at four corners by four adjacent measurement pixels 28, and including one of the four measurement pixels 28. In the case of FIG. 5, each sub-irradiation region 29 is composed of 4×4 pixels.

In one irradiation region 34, n×m sub-irradiation regions 29 are two-dimensionally arrayed in the x and y directions. The XY stage 105 is moved to a position where one unit inspection region 33 can be irradiated with the multiple beams 20. Then, the XY stage 105 is stopped at that position, and regarding this unit inspection region 33 as the irradiation region 34, the inside of the unit inspection region 33 concerned is scanned. Each beam of the multiple beams 20 takes charge of anyone of the sub-irradiation regions 29 which are different from each other. At the time of each shot, each beam irradiates one measurement pixel 28 whose position and that of the beam concerned correspond to the same position in the sub-irradiation region 29 concerned. In the example of FIG. 5, the first shot of each beam irradiates the first measurement pixel 36 from the right in the bottom row in the sub-irradiation region 29 concerned. Then, the deflector 208 shifts the beam deflection position in the y direction by the amount of one measurement pixel 36 by collectively deflecting the entire multiple beams 20, and the second shot irradiates the first measurement pixel 36 from the right in the second row from the bottom in the sub-irradiation region 29 concerned. Similarly, the third shot irradiates the first measurement pixel 36 from the right in the third row from the bottom in the sub-irradiation region 29 concerned. The fourth shot irradiates the first measurement pixel 36 from the right in the fourth row from the bottom in the sub-irradiation region 29 concerned. Next, the deflector 208 shifts the beam deflection position to the position of the second measurement pixel 36 from the right in the bottom row by collectively deflecting the entire multiple beams 20, and, similarly, the measurement pixels 36 are irradiated in order in the y direction. By repeating this operation, all the measurement pixels 36 in one sub-irradiation region 29 are irradiated in order with one beam. With respect to one shot, the secondary electrons 300 of secondary electron fluxes corresponding to a plurality of shots whose maximum number is the same as the number of a plurality of holes 22 are detected at a time, based on the multiple beams formed by passing through a plurality of holes 22 in the shaping aperture array substrate 203.

As described above, the electron beam column 102 scans the substrate 101 on which patterns are formed, by using the multiple beams 20 configured by a plurality of electron beams. The entire multiple beams 20 scans the unit inspection region 33 as the irradiation region 34, and that is, each beam individually scans one corresponding sub-irradiation region 29. In a state where the XY stage 105 remains stopped, after scanning one unit inspection region 33 is completed, the irradiation region 34 moves to a next adjacent unit inspection region 33 by a step operation in order to scan the next adjacent unit inspection region 33 while the XY stage 105 remains stopped. Thus, the "step and repeat" operation is repeated to proceed to scan each chip 32. Due to shots of the multiple beams 20, the secondary electrons 300 are emitted upward from the irradiated measurement pixel 36 at each time of the shot so as to be detected by the detector 222. The detector 222 detects the emitted secondary electrons 300 for each measurement pixel 36 (or each sub-irradiation region 29).

Detected data on the secondary electrons 300 from each measurement pixel 36 detected by the detector 222 is output to the detection circuit 106 in order of measurement. In the detection circuit 106, the detected data in analog form is converted into digital data by an A-D converter (not shown), and stored in the chip pattern memory 123. Then, when the detected data has been accumulated for the amount of one chip 32, the accumulated data is transmitted as chip pattern data to the comparison circuit 108, with information on each position from the position circuit 107.

By performing scanning using the multiple beams 20 as described above, the scanning operation (measurement) can be performed at a higher speed than scanning by a single beam.

Although beam ON/OFF is performed for each pixel 36 in the example described above, it is not limited thereto. Scanning may be performed, for each sub-irradiation region 29, by continuous beam while the sub-irradiation region 29 concerned is scanned by a corresponding beam. In other words, it may be beam OFF during the step operation.

Moreover, the operation of acquiring secondary electron images is not limited to the "step and repeat" operation. It is also preferable to perform a scanning operation sequentially while the XY stage 105 moves continuously. In that case, the deflection control circuit 128 controls (tracking control) deflecting positions so that the deflecting position deflected by the deflector 208 may follow the movement of the stage.

During the secondary electron image acquisition operation (scanning operation), a change (interference) in temperature, atmospheric air pressure, magnetic field, vibration, and sound may occur in the installation environment 300. The change of an interfering factor, such as temperature, atmospheric air pressure, magnetic field, vibration, and sound can be classified into two types: an offset change (DC change) which does not return to the original state even if a certain period of time has passed, and a momentary change (AC change) which returns to the original state within a certain period of time. For example, a change in temperature or atmospheric air pressure is usually assumed to be a DC change. On the other hand, a change in vibration or sound is usually assumed to be an AC change. A change in a magnetic field is assumed to be a DC change or an AC change. If a DC change is change in a magnetic field, the beam trajectory in the electron optical system is statically changed, which results in a beam position change (drift) on the surface of the substrate 101 or in a distortion of beam deflection shape. If a DC change is change in temperature or atmospheric air pressure, the shape of mounted parts of the inspection apparatus 100 and/or the shape of the inspection substrate 101 are distorted, which results in an apparent position change (drift). On the other hand, an AC change makes a beam vibrate, which results in degradation of beam resolution. Then, according to the first embodiment, during the acquisition operation (scanning operation) for acquiring a secondary electron image, using each sensor, a change of an interfering factor, such as temperature, atmospheric air pressure, magnetic field, vibration, and sound is monitored at a predetermined sampling period. According to the first embodiment, commencing before the time of the secondary electron image acquisition start processing (S102), the temperature sensor 10, the atmospheric air pressure sensor 12, the magnetic sensor 14, the vibration sensor 16, and the sound sensor 18 individually measure each value of a corresponding interfering factor at a predetermined sampling period $\Delta t$. For example, measuring is performed at 10 ms to 1 s period. The sampling period $\Delta t$ may be a value commonly used in measuring all the interfering factors or a different value for each interfering factor.

In the interference detection processing (S104), the interference circuit 140 inputs a signal from each sensor, calculates a change amount, and detects an interfering factor exceeding a threshold.

Figure 6:
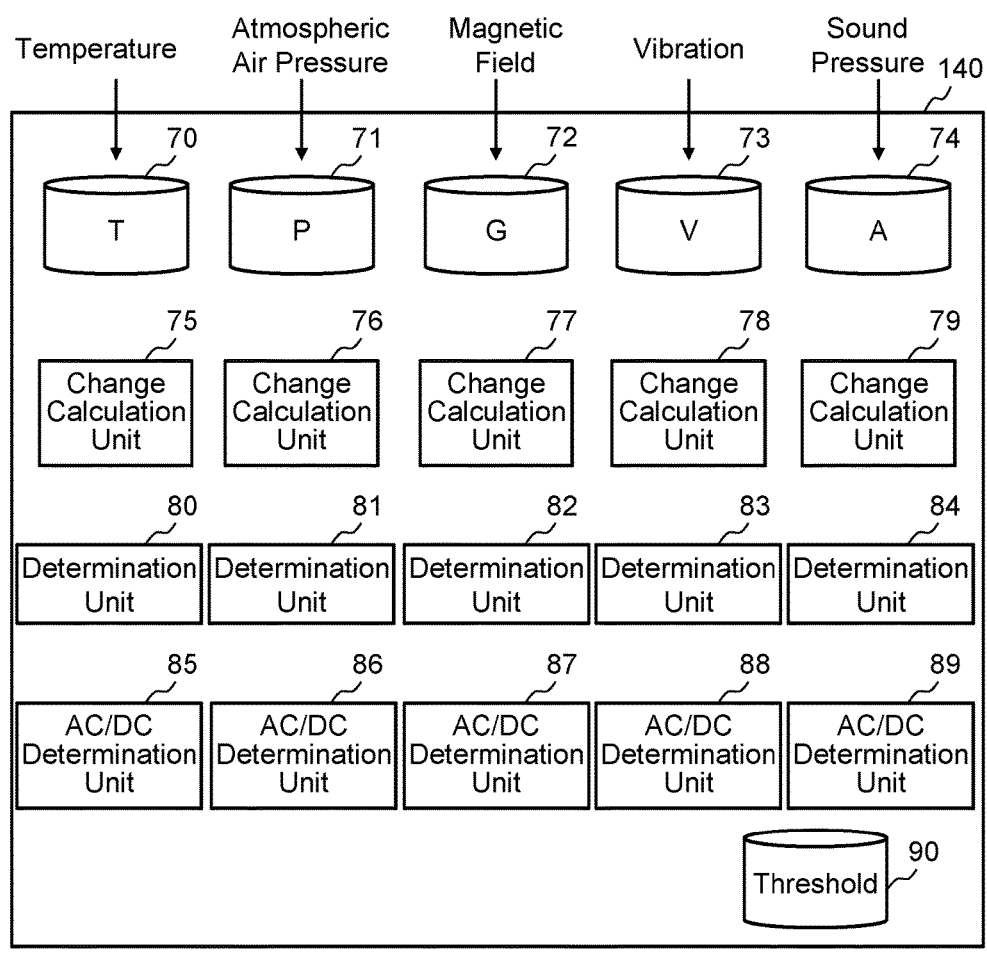
FIG. 6 is a block diagram showing an internal configuration of an interference circuit according to the first embodiment.

FIG. 6 is a block diagram showing an internal configuration of an interference circuit according to the first embodiment. As shown in FIG. 6, storage devices 70, 71, 72, 73, 74, and 90 such as magnetic disk drives, change calculation units 75, 76, 77, 78, and 79, determination units 80, 81, 82, 83, and 84, and AC/DC determination units 85, 86, 87, 88, and 89 are arranged in the interference circuit 140. Each of the " . . . units" such as the change calculation units 75, 76, 77, 78, and 79, the determination units 80, 81, 82, 83, and 84, and the AC/DC determination units 85, 86, 87, 88, and 89 includes a processing circuitry. As the processing circuitry, for example, an electric circuit, computer, processor, circuit board, quantum circuit, or semiconductor device may be used. Each of the " . . . units" may use a common processing circuitry (same processing circuitry), or different processing circuitries (separate processing circuitries). Input data necessary for the change calculation units 75, 76, 77, 78, and 79, the determination units 80, 81, 82, 83, and 84, and the AC/DC determination units 85, 86, 87, 88, and 89, and operated (calculated) results are stored in a memory (not shown) each time.

Temperature data (T) measured by the temperature sensor 10 is stored in the storage device 70, and accumulated during a predetermined time period. Atmospheric air pressure data (P) measured by the atmospheric air pressure sensor 12 is stored in the storage device 71, and accumulated during a predetermined time period. Magnetic data (G) measured by the magnetic sensor 14 is stored in the storage device 72, and accumulated during a predetermined time period. Vibration data (V) measured by the vibration sensor 16 is stored in the storage device 73, and accumulated during a predetermined time period. Acoustic data (A) measured by the sound sensor 18 is stored in the storage device 74, and accumulated during a predetermined time period. The predetermined time period concerning each of a plurality of interfering factors described above may be the same or different.

The change calculation unit 75 reads, for each measurement, the temperature data (T) from the storage device 70, and calculates a difference, as a temperature change amount, by subtracting the last measured value from the current measured value, namely, the difference is $\Delta T(=T(t)-T(t-\Delta t))$.

The change calculation unit 76 reads, for each measurement, the atmospheric air pressure data (P) from the storage device 71, and calculates a difference, as an atmospheric air pressure change amount, by subtracting the last measured value from the current measured value, namely, the difference is $\Delta P(=P(t)-P(t-\Delta t))$.

The change calculation unit 77 reads, for each measurement, the magnetic data (G) from the storage device 72, and calculates a difference, as a magnetic field change amount, by subtracting the last measured value from the current measured value, namely, the difference is $\Delta G(=G(t)-G(t-\Delta t))$.

The change calculation unit 78 reads, for each measurement, the vibration data (V) from the storage device 73, and calculates a difference, as a vibration change amount, by subtracting the last measured value from the current measured value, namely, the difference is $\Delta V(=V(t)-V(t-\Delta t))$.

The change calculation unit 79 reads, for each measurement, the acoustic data (A) from the storage device 74, and calculates a difference, as a sound change amount, by subtracting the last measured value from the current measured value, namely, the difference is $\Delta A(=A(t)-A(t-\Delta t))$. It is preferable that the acoustic data (A) is measured as a sound pressure level (dB), for example.

The determination unit 80 determines, for each measurement, whether the temperature change amount $\Delta T$ exceeds a threshold Tth. The determination unit 81 determines, for each measurement, whether the atmospheric air pressure change amount $\Delta P$ exceeds a threshold Pth. The determination unit 82 determines, for each measurement, whether the magnetic field change amount $\Delta G$ exceeds a threshold Gth. The determination unit 83 determines, for each measurement, whether the vibration change amount $\Delta V$ exceeds a threshold Vth. The determination unit 84 determines, for each measurement, whether the sound change amount $\Delta A$ exceeds a threshold Ath. The change thresholds Tth, Pth, Gth, Vth, and Ath of each interfering factor are stored in the storage device 90 in advance. The upper limit and the lower limit of each of the change thresholds Tth, Pth, Gth, Vth, and Ath of each interfering factor are set. A determination result is output to the control computer 110.

In the secondary electron image acquisition suspending processing (S106), with respect to a plurality of interfering factors to be measured, if a change of at least one of them exceeds a corresponding threshold, the secondary electron image acquisition mechanism 150 once suspends acquiring a secondary electron image at the time it is determined that a change exceeding a threshold has occurred. Moreover, an alarm is output. Then, the secondary electron image acquisition mechanism 150 moves the XY stage 105 such that the mark 306 comes at the position of the irradiation region 34 of the multiple beams 20.

In the determination processing (S108), when at least one of change amounts of a plurality of interfering factors exceeds a corresponding threshold, the interference circuit 142 determines, for each interfering factor exceeding a threshold, whether the change exceeding the threshold is an AC change (first case) which returns to the original state within a predetermined time period, or whether the change exceeding the threshold is a DC change (second case) which does not return to the original state even when the predetermined time period has passed. For example, usually, an atmospheric air pressure change does not occur rapidly. Therefore, it is desirable to have a waiting time by minutes. Accordingly, for example, one to ten minutes is preferable as the predetermined time period (waiting time). For example, five minutes is preferable. Alternatively, it is also preferable to previously perform measurement about for twenty-four hours, and to determine a waiting time based on the data. The predetermined time period (waiting time) concerning each of a plurality of interfering factors described above may be the same or different. Specifically, it operates as follows:

In the case where the temperature change amount $\Delta T$ exceeds the threshold Tth, the AC/DC determination unit 85 determines whether the change exceeding the threshold Tth is an AC change (first case) which returns to the original state within a predetermined time period, or a DC change (second case) which does not return to the original state even if the predetermined time period has passed. The determination result is output to the control computer 110.

In the case where the atmospheric air pressure change amount ΔP exceeds the threshold Pth, the AC/DC determination unit 86 determines whether the change exceeding the threshold Pth is an AC change (first case) which returns to the original state within a predetermined time period, or a DC change (second case) which does not return to the original state even if the predetermined time period has passed. The determination result is output to the control computer 110.

In the case where the magnetic field change amount ΔG exceeds the threshold Gth, the AC/DC determination unit 87 determines whether the change exceeding the threshold Gth is an AC change (first case) which returns to the original state within a predetermined time period, or a DC change (second case) which does not return to the original state even if the predetermined time period has passed. The determination result is output to the control computer 110.

In the case where the vibration change amount ΔV exceeds the threshold Vth, the AC/DC determination unit 88 determines whether the change exceeding the threshold Vth is an AC change (first case) which returns to the original state within a predetermined time period, or a DC change (second case) which does not return to the original state even if the predetermined time period has passed. The determination result is output to the control computer 110.

In the case where the sound change amount ΔA exceeds the threshold Ath, the AC/DC determination unit 89 determines whether the change exceeding the threshold Ath is an AC change (first case) which returns to the original state within a predetermined time period, or a DC change (second case) which does not return to the original state even if the predetermined time period has passed. The determination result is output to the control computer 110.

Figure 7:
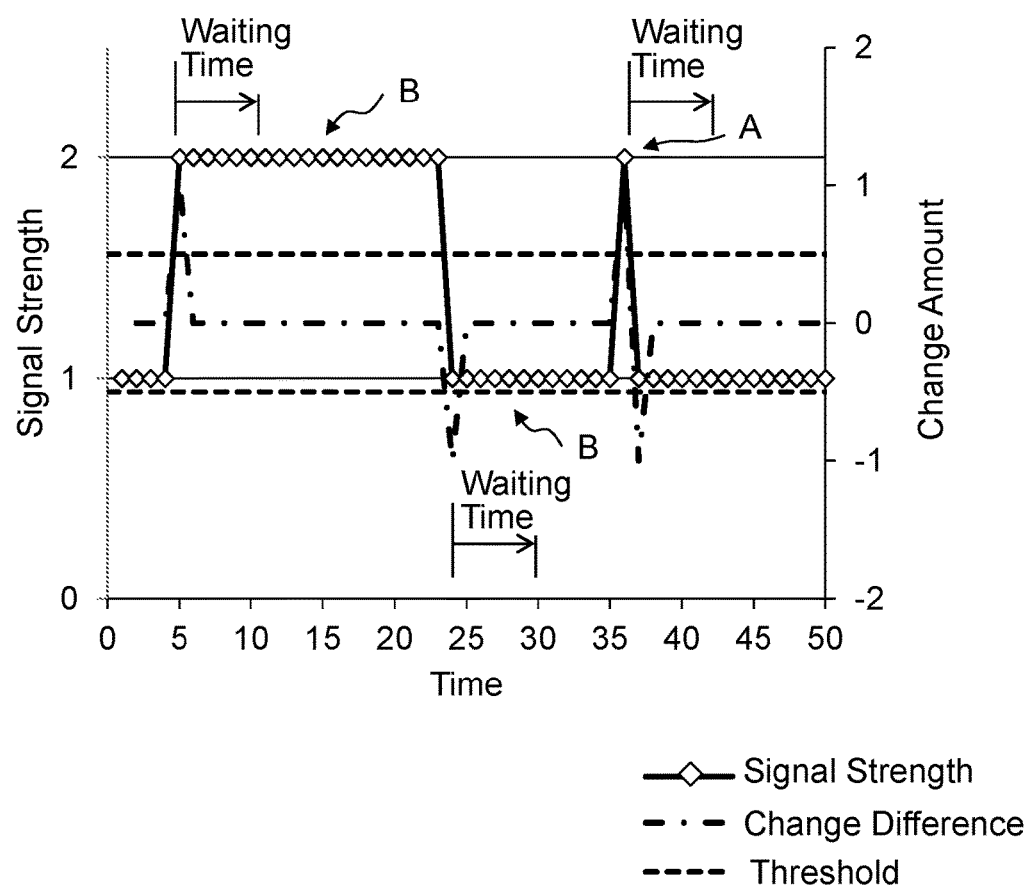
FIG. 7 illustrates an example of interference factor change according to the first embodiment.

FIG. 7 illustrates an example of interference factor change according to the first embodiment. In FIG. 7, the left side of the ordinate axis represents signal strength, and the right side of it represents a change amount (difference value) between the current measured value and the last measured value. The abscissa axis represents time. In the graph of FIG. 7, an address unit (A.U.) is used as the unit of each of the ordinate axis and the abscissa axis. The example of FIG. 7 shows change of one of a plurality of interfering factors. In the case of FIG. 7, the change amount threshold is set to ±0.5 A.U. When the signal strength is changed to 2 A.U. from 1 A.U., since the change amount (difference) is 1 A.U., the threshold is exceeded. At this stage, acquisition of a secondary electron image is suspended. If the signal strength at the next measurement time still keeps 2 A.U., the change amount (difference) becomes zero. In the case where the signal strength does not return to 1 A.U. even when a pre-set waiting time has passed since the signal strength changed to 2 A.U. from 1 A.U., the change is determined to be a DC change (B section). On the other hand, in the case where the signal strength returns to 1 A.U. within a pre-set waiting time since the signal strength changed to 2 A.U. from 1 A.U., the change is determined to be an AC change (A section).

Figures 8A, 8B, 8C, 8D:
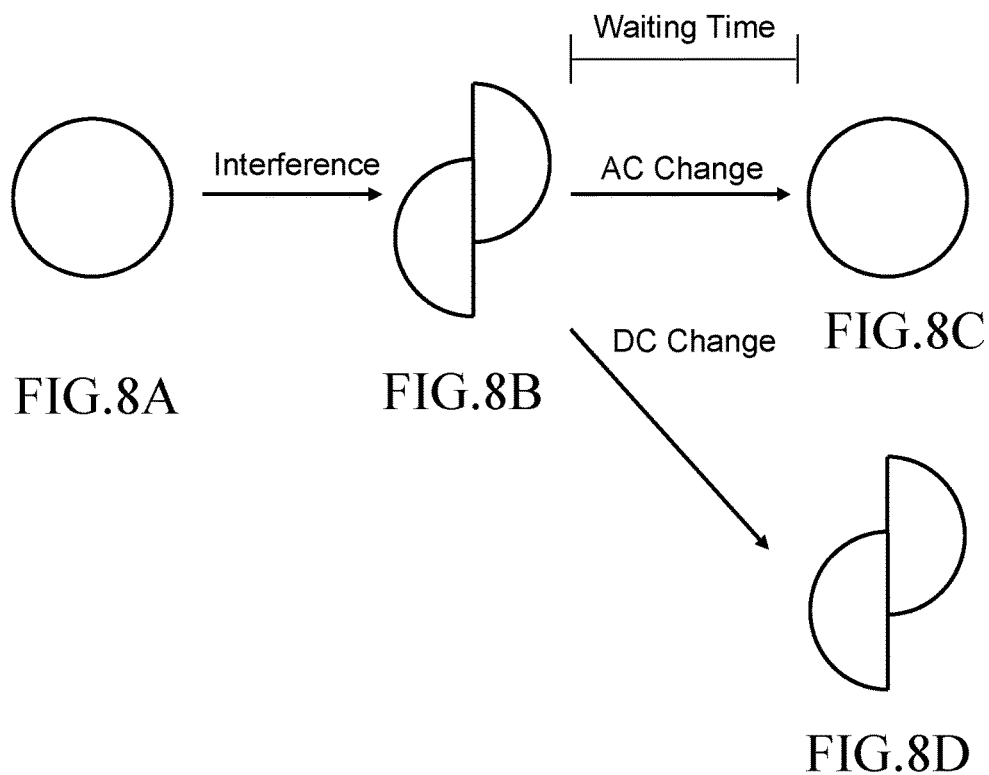
FIGS. 8A to 8D show examples of an acquired secondary electron image according to the first embodiment.

FIGS. 8A to 8D show examples of an acquired secondary electron image according to the first embodiment. For example, when a circular pattern is scanned in the state where no interference has occurred, a secondary electron image is acquired as the circular pattern as it is as shown in FIG. 8A. On the other hand, when an interfering factor change exceeding a threshold occurs during scanning, a secondary electron image is acquired as an image in which the position of the right half scanned after the interfering factor change having occurred is shifted (deviated) from the position of the left half scanned first, as shown in FIG. 8B. When the change is an AC change, if scanning has been suspended during the waiting time, a secondary electron image can be acquired as a circular pattern shown in FIG. 8C. However, when the change is a DC change, even if scanning has been suspended (stopped) during the waiting time, a secondary electron image is acquired as an image in which the position of the right half scanned after the interfering factor change having occurred is shifted (deviated) from the position of the left half scanned first, as shown in FIG. 8D. Then, according to the first embodiment, the subsequent processing in the case of the AC change differs from that in the case of the DC change. In the determination processing (S108), if it is determined that interfering factor changes having occurred are all AC changes, it progresses to inspection position setting processing (S112). In determination processing (S108), if it is determined that at least one of interfering factor changes having occurred is a DC change, it progresses to the calibration processing (S110).

In the calibration processing (S110), the drift measurement circuit 142 measures a shift deviation (drift amount) of the irradiation position of the multiple beams 20.

Specifically, it operates as follows: The secondary electron image acquisition mechanism 150 scans the mark 306 with the multiple beams 20. Specifically, the detector 222 detects the secondary electrons 300 generated when the mark 306 is scanned with the multiple beams 20 by beam deflection by the deflector 208. Secondary electron image data detected by the detector 222 and processed by the detection circuit 106 is output, with position information measured by the position circuit 107, to the drift measurement circuit 142. The drift measurement circuit 142 measures a shift deviation of the mark position, using acquired image and position information.

Figure 9:
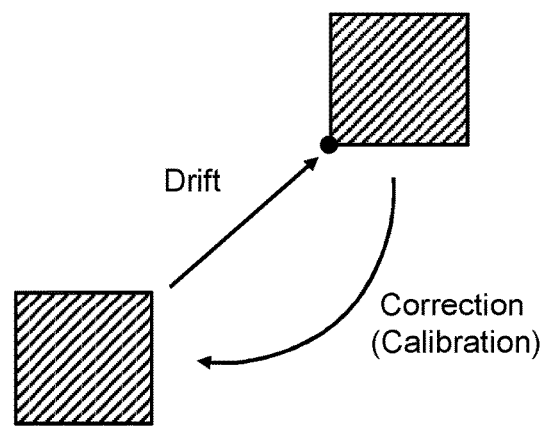
FIG. 9 illustrates a method of calibration according to the first embodiment.

FIG. 9 illustrates a method of calibration according to the first embodiment. As shown in FIG. 9, in the case of the mark position being sifted (deviated) by drift, the deflection control circuit 28 calculates a correction amount for correcting (calibrating) the position deviation by the deflector 208. Then, when acquiring a secondary electron image of the substrate 101, it can be acquired while deflecting the irradiation position (deflecting position) of the multiple beams 20 to the position which has been shifted by an offset value being the correction amount for the calibration. The offset value may be stored in the storage device (not shown) in the deflection control circuit 128.

As described above, when a DC change occurs, the secondary electron image acquisition mechanism 150 suspends the acquisition operation of a secondary electron image, and calibrates the change amount of multiple beams. Then, it progresses to the inspection position setting processing (S112). On the other hand, when an AC change occurs, although the secondary electron image acquisition mechanism 150 suspends the acquisition operation of a secondary electron image, after a waiting time has passed, it progresses to the inspection position setting processing (S112) without calibrating the change amount of multiple beams.

In the inspection position setting processing (S112), the control computer 110 sets the position, as an inspection restart position, where secondary electron image acquisition was previously performed, which is previous, by a sampling period Δt, to the position where secondary electron image acquisition is suspended due to interference occurrence. Although here returned to the position previous by the sampling period Δt, it is not limited thereto. It should be understood that returning to a more previous position is also preferable. If the distance to return becomes long, the inspection time is prolonged by the length of the distance. In order to shorten the inspection time as much as possible, it is preferable to return, by the sampling period Δt, to the position where no interfering factor change occurred.

In the secondary electron image acquisition restart processing (S114), the secondary electron image acquisition mechanism 150 moves the XY stage 105 such that the inspection position having been set for restarting the inspection comes at the position of the irradiation region 34. Then, the secondary electron image acquisition mechanism 150 restarts the acquisition operation of secondary electron image, which has been suspended, from the inspection position having been set for restarting the inspection.

With respect to all the inspection regions, the processing described above from the interference detection processing (S104) to the secondary electron image acquisition restart processing (S114) is repeated until acquisition of secondary electron images has been completed. As described above, the secondary electron images of the substrate 101 are acquired.

As described above, according to the first embodiment, it is possible to highly accurately acquire a secondary electron image even when a change of an interfering factor occurs.

In the inspection apparatus 100, a reference image is generated before or after or in parallel to the secondary electron image acquisition step (S100).

In the reference image generation step (S130), if the substrate 101 is a semiconductor substrate, the reference image generation unit, such as the development circuit 111 and the reference circuit 112, generates a reference image of a region corresponding to a measured image (secondary electron image) of the sub-irradiation region 29 configured by a plurality of pixels 36, based on exposure image data defining an exposure image on the substrate used when a mask pattern of an exposure mask is exposed and transferred onto the semiconductor substrate. Instead of the exposure image data, writing data (design data) may be used which is a base for forming an exposure mask to expose and transfer a plurality of figure patterns onto the substrate 101. If the substrate 101 is an exposure mask, the reference image generation unit, such as the development circuit 111 and the reference circuit 112, generates a reference image of a region corresponding to a measured image (secondary electron image) of the sub-irradiation region 29 configured by a plurality of pixels 36, based on writing data (design data) which is abase for forming a plurality of figure patterns on the substrate 101. The secondary electron image may be generated in units of the unit inspection region 33 in which one sub-irradiation region 29 is one pixel, by making the resolution of the secondary electron image lower than that of an image in units of the sub-irradiation region 29. In such a case, similarly, a reference image may be generated in units of the unit inspection region 33 in which one sub-irradiation region 29 is one pixel, by making the resolution of the reference image lower than that of an image generated in units of the sub-irradiation region 29. In the case of the sub-irradiation region 29 being one pixel, the pattern occupancy in the sub-irradiation region 29 may be set as a gray scale value.

Specifically, it operates as follows: First, the development circuit 111 reads writing data (or exposure image data) from the storage device 109 through the control computer 110, converts each figure pattern of each irradiation region 34 defined in the read writing data (or exposure image data) into image data of binary or multiple values, and transmits this image data to the reference circuit 112.

Here, basics of figures defined by the writing data (or exposure image data) are, for example, rectangles or triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When the writing data (or exposure image data) used as figure data is input to the development circuit 111, the data is developed into data of each figure. Then, figure codes, figure dimensions and the like indicating figure shapes in the figure data are interpreted. Then, the development circuit 111 develops design image data of binary or multiple values as patterns to be arranged in squares in units of grids of a predetermined quantization dimension, and outputs the developed data. In other words, the development circuit 111 reads design data, calculates the occupancy rate of a figure occupying a design pattern for each square obtained by virtually dividing an inspection region into squares in units of a predetermined dimension, and outputs n-bit occupancy rate data. For example, it is preferable that one square is set as one pixel. Assuming that one pixel has a resolution of $1/2^8$ ($=1/256$), the occupancy rate in each pixel is calculated by allocating small regions, each corresponding to $1/256$, to the region of a figure arranged in the pixel concerned. Then, the occupancy rate data of eight bits is output to the reference circuit 112. The size of the square should preferably be the same as that of the measurement pixel 36. In the case where the sub-irradiation region 29 is one pixel, the square size should preferably be the same as that of the sub-irradiation region 29.

Next, the reference circuit 112 performs appropriate filter processing on design image data which is the transmitted figure image data. Since measured data as a secondary electron image obtained from the detection circuit 106 is in the state affected by filtering by the electron optical system, in other words, in the analog state continuously changing, it is possible to match/fit the design image data with the measured data by also performing filtering on the design image data being image data on the design side whose image intensity (gray value) is represented by digital values. In this manner, a design image (reference image) to be compared with a measured image (secondary electron image) of the sub-irradiation region 29 is generated. Image data of the generated reference image is input to the comparison circuit 108 to be stored in the memory.

Figure 10:
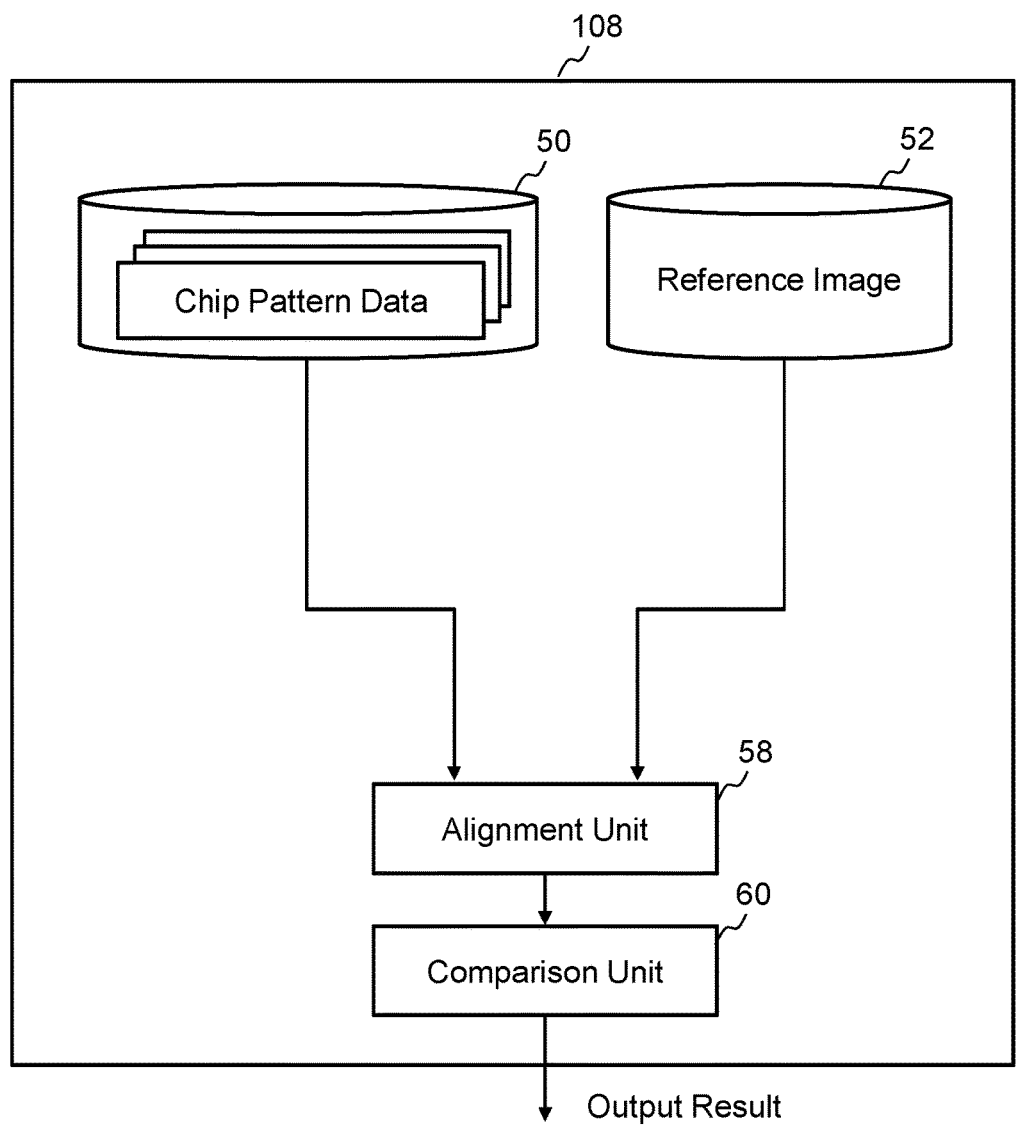
FIG. 10 shows an internal configuration of a comparison circuit according to the first embodiment.

FIG. 10 shows an internal configuration of a comparison circuit according to the first embodiment. In FIG. 10, storage devices 50 and 52, such as magnetic disk drives, an alignment unit 58, and a comparison unit 60 are arranged in the comparison circuit 108. Each of the "units" such as the alignment unit 58 and the comparison unit 60 includes a processing circuitry. As the processing circuitry, for example, an electric circuit, computer, processor, circuit board, quantum circuit, or semiconductor device may be used. Each of the "units" may use a common processing circuitry (same processing circuitry), or different processing circuitries (separate processing circuitries). Input data required in the alignment unit 58 and the comparison unit 60, and calculated results are stored in a memory (not shown) each time.

In the comparison step (S200), the comparison circuit 108 (comparison unit) inputs a reference image of the region corresponding to the acquired secondary electron image, and compares the secondary electron image with the reference image. Specifically, it operates as follows:

Chip pattern data transmitted from the detector 222 is temporarily stored, with information indicating each position from the position circuit 107, in the storage device 50. Similarly, reference image data is temporarily stored, with information indicating each design position, in the storage device 52.

Next, the alignment unit 58 provides alignment between a secondary electron image (measured image) and a reference image, for each sub-pixel unit smaller than the pixel 36. For example, the alignment may be performed by a least-square method.

The comparison unit 60 compares, for each pixel 36, the secondary electron image concerned and the reference image concerned. The comparison unit 60 compares both the images for each pixel 36, based on predetermined determination conditions in order to determine whether there is a defect such as a shape defect. For example, if a gray scale value difference of each pixel 36 is larger than a determination threshold Th, it is determined that there is a defect. Then, the comparison result is output, and specifically, output to the storage device 109, monitor 117, or memory 118, or alternatively, output from the printer 119. In the case of an image whose pixel is the sub-irradiation region 29, the pixel 36 should be read as the sub-irradiation region 29.

Each of change thresholds Tth, Pth, Gth, Vth, and Ath of the interfering factors described above is set for each interfering factor, based on a drift amount of the multiple beams 20 resulting from change of the interfering factor concerned. Usually, with respect to an interfering factor in which no AC change occurs, the drift measurement circuit 142 may measure a drift amount which occurs while the state of compulsorily changing the interfering factor concerned is maintained. The change amount due to which a drift exceeding an acceptable value occurs should be set as a threshold.

As described above, according to the first embodiment, enhancement of production facilities or equipment on the customer side to be in accordance with strict installation environment specifications can be inhibited, and enhancement of corresponding facilities or equipment on the apparatus side can also be inhibited.

In the above description, each " . . . circuit" includes a processing circuitry. As the processing circuitry, for example, an electric circuit, computer, processor, circuit board, quantum circuit, semiconductor device, or the like can be used. Each " . . . circuit" may use a common processing circuitry (same processing circuitry), or different processing circuitries (separate processing circuitries). A program for causing a processor to execute processing may be stored in a recording medium, such as a magnetic disk drive, magnetic tape drive, FD, ROM (Read Only Memory), etc.

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed.

In addition, any other pattern inspection apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam inspection apparatus comprising:

a secondary electron image acquisition mechanism configured to perform an acquisition operation of a secondary electron image of a secondary electron including a reflected electron emitted from a substrate due to irradiation with multiple charged particle beams on the substrate;

a plurality of sensors, arranged inside or on a periphery of the secondary electron image acquisition mechanism, configured to measure a plurality of interfering factors;

a determination circuit configured to determine, for each of the plurality of interfering factors at a respective sampling period, whether change exceeding a corresponding threshold is a first case which returns to an original state within a predetermined time period, or a second case which does not return to the original state even if the predetermined time period has passed; and a comparison circuit configured to input a reference image of a region corresponding to the secondary electron image acquired, and compare the secondary electron image with the reference image, wherein the secondary electron image acquisition mechanism is configured to suspend the acquisition operation of the secondary electron image when the change of the interfering factor exceeds the corresponding threshold, the secondary electron image acquisition mechanism is configured to, in a case where change of the second case occurs, calibrate a change amount of the multiple charged particle beams and restart the acquisition operation of the secondary electron image after the calibration, from a restart position which is previous, by the sampling period, to a position where the acquisition operation of the secondary electron image was suspended, and the secondary electron image acquisition mechanism is configured to, in a case where change of the first case occurs, restart the acquisition operation of the secondary electron image after the predetermined time period has passed, from a restart position which is previous, by the sampling period, to a position where the acquisition operation of the secondary electron image was suspended, without calibrating a change amount of the multiple charged particle beams.

2. The apparatus according to claim 1, wherein at least one of temperature, atmospheric air pressure, magnetic field, vibration, and sound in installation environment in which the secondary electron image acquisition mechanism is installed is used as at least one of the plurality of interfering factors.

3. The apparatus according to claim 1, wherein the corresponding threshold is set for the each of the plurality of interfering factors, based on a drift amount of the multiple charged particle beams resulting from change of the interfering factor concerned.

4. The apparatus according to claim 1, wherein the determination circuit inputs a result measured by the plurality of sensors, and calculates each change amount.

5. The apparatus according to claim 4, wherein the determination circuit includes a temperature change calculation circuit which calculates a change amount of temperature.

6. The apparatus according to claim 5, wherein the determination circuit includes an atmospheric air pressure change calculation circuit which calculates a change amount of atmospheric air pressure.

7. The apparatus according to claim 6, wherein the determination circuit includes a magnetic field change calculation circuit which calculates a change amount of magnetic field.

8. The apparatus according to claim 7, wherein the determination circuit includes a vibration change calculation circuit which calculates a change amount of vibration.

9. The apparatus according to claim 8, wherein the determination circuit includes a sound change calculation circuit which calculates a change amount of sound.

10. A multi charged particle beam inspection method comprising:
performing an acquisition operation of a secondary electron image which includes a reflected electron emitted from a substrate due to irradiation with multiple charged particle beams on the substrate;
measuring a plurality of interfering factors inside or on a periphery of a secondary electron image acquisition mechanism;
determining, for each of the plurality of interfering factors, in a case where change exceeding a corresponding threshold occurs in at least one of the plurality of interfering factors, whether the change is a first case which returns to an original state within a predetermined time period, or a second case which does not return to the original state even if the predetermined time period has passed;
suspending the acquisition operation of the secondary electron image when the change of the interfering factor exceeds the corresponding threshold;
in a case where change of the second case occurs, calibrating a change amount of the multiple charged particle beams, and restarting the acquisition operation of the secondary electron image after the calibrating, from a restart position which is previous, by the sampling period, to a position where the acquisition operation of the secondary electron image was suspended; and
in a case where change of the first case occurs, restarting the acquisition operation of the secondary electron image after the predetermined time period has passed, from a restart position which is previous, by the sampling period, to a position where the acquisition operation of the secondary electron image was suspended, without calibrating a change amount of the multiple charged particle beams.

11. A multi charged particle beam inspection apparatus comprising:
a secondary electron image acquisition mechanism configured to perform an acquisition operation of a secondary electron image of a secondary electron including a reflected electron emitted from a substrate due to irradiation with multiple charged particle beams on the substrate;
an interference circuit configured to calculate a change amount of an interfering factor based on input from at least one sensor, detect the change amount of the interfering factor exceeding a threshold, and determine whether the change of the interfering factor exceeding the threshold is a first case in which the change of the interfering factor returns to an original state which is lower than the threshold within a predetermined time period, or a second case in which the change of the interfering factor does not return to the original state even if the predetermined time period has passed; and
a comparison circuit configured to compare the secondary electron image acquired and a reference image of a region corresponding to the secondary electron image acquired,
wherein the secondary electron image acquisition mechanism is configured to suspend the acquisition operation of the secondary electron image when the interference circuit detects that the change amount of the interfering factor exceeds the threshold,
the secondary electron image acquisition mechanism is configured to, in a case where the first case occurs, restart the acquisition operation of the secondary electron image after the predetermined time period has passed, from a restart position on the substrate which is previous to a position where the change amount of the interfering factor exceeding the threshold was detected by the interference circuit, without calibrating a change amount of the multiple charged particle beams, and
the secondary electron image acquisition mechanism is configured to, in a case where change of the second case occurs, calibrate a change amount of the multiple charged particle beams, and restart the acquisition operation of the secondary electron image after the calibration, from a restart position on the substrate which is previous to a position where the interfering factor exceeding the threshold was detected by the interference circuit.

12. The apparatus according to claim 11, wherein the restart position is previous, by a sampling period of the change amount of the interfering factor, or more, to a position where the change amount of the interfering factor exceeding the threshold was detected by the interference circuit.

13. The apparatus according to claim 11, wherein the restart position is previous, by a sampling period of the change amount of the interfering factor, to a position where the change amount of the interfering factor exceeding the threshold was detected by the interference circuit.

14. The apparatus according to claim 11, wherein the restart position is previous, by a sampling period of the change amount of the interfering factor, or more, to a position where the acquisition operation of the secondary electron image was suspended.

15. The apparatus according to claim 11, wherein the restart position is previous, by a sampling period of the change amount of the interfering factor, to a position where the acquisition operation of the secondary electron image was suspended.

16. The apparatus according to claim 11, wherein the at least one sensor is configured to measure at least one of temperature, atmospheric air pressure, magnetic field, vibration, and sound in installation environment in which the secondary electron image acquisition mechanism is installed.

17. The apparatus according to claim 11, wherein the threshold is set based on a drift amount of the multiple charged particle beams resulting from change of the interfering factor.

18. The apparatus according to claim 11, further comprising a plurality of sensors configured to measure a plurality of interfering factors, wherein the interference circuit is configured to calculate a change amount of each of the plurality of interfering factors and detect, for each of the plurality of interfering factors, whether the change amount exceeds a respective threshold.

19. The apparatus according to claim 18, wherein the corresponding threshold is set for the each of the plurality of interfering factors, based on a drift amount of the multiple charged particle beams resulting from change of the interfering factor concerned.

* * * * *